United States Patent
Ekiz

(10) Patent No.: US 10,236,926 B2
(45) Date of Patent: Mar. 19, 2019

(54) ASSESSMENT AND/OR DESIGN OF MULTIPLE-ANTENNA SYSTEMS

(71) Applicant: Bayerische Motoren Werke Aktiengesellschaft, Munich (DE)

(72) Inventor: Levent-Yusuf Ekiz, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 15/900,065

(22) Filed: Feb. 20, 2018

(65) Prior Publication Data

US 2018/0175899 A1 Jun. 21, 2018

Related U.S. Application Data

(63) Continuation of application No. PCT/EP2016/069466, filed on Aug. 17, 2016.

(30) Foreign Application Priority Data

Aug. 21, 2015 (DE) .......................... 10 2015 215 993

(51) Int. Cl.
| | |
|---|---|
| *H04B 7/0491* | (2017.01) |
| *H04B 1/3822* | (2015.01) |
| *G01R 29/10* | (2006.01) |
| *H04B 17/19* | (2015.01) |
| *H04B 17/29* | (2015.01) |
| *H01Q 1/32* | (2006.01) |
| *H04B 7/0413* | (2017.01) |

(52) U.S. Cl.
CPC .......... *H04B 1/3822* (2013.01); *G01R 29/10* (2013.01); *H01Q 1/3283* (2013.01); *H04B 17/19* (2015.01); *H04B 17/29* (2015.01); *H04B 7/0413* (2013.01)

(58) Field of Classification Search
CPC .................................................... H04B 1/3822
See application file for complete search history.

(56) References Cited

U.S. PATENT DOCUMENTS

| | | | |
|---|---|---|---|
| 6,266,528 B1 | 7/2001 | Farzaneh | |
| 2012/0038522 A1* | 2/2012 | Miyata | G01R 29/10 343/703 |
| 2013/0230088 A1 | 9/2013 | Arad et al. | |

(Continued)

FOREIGN PATENT DOCUMENTS

DE 10 2013 206 519 A1 10/2014

OTHER PUBLICATIONS

International Search Report (PCT/ISA/210) issued in PCT Application No. PCT/EP2016/069466 dated Nov. 23, 2016 with English translation (seven pages).

(Continued)

*Primary Examiner* — Tuan H Nguyen
(74) *Attorney, Agent, or Firm* — Crowell & Moring LLP

(57) ABSTRACT

In a method for determining the performance of at least one antenna in a system including a plurality of antennas, the method subdivides a reception area and/or a transmission area of at least one antenna into a plurality of sectors, determines at least one value of a performance parameter for at least one of the plurality of sectors indicating an antenna performance, and determines at least one statistical value from the values of the performance parameter.

18 Claims, 5 Drawing Sheets

(56) References Cited

U.S. PATENT DOCUMENTS

2013/0300616 A1    11/2013    Reed

OTHER PUBLICATIONS

German-language Written Opinion (PCT/ISA/237) issued in PCT Application No. PCT/EP2016/069466 dated Nov. 23, 2016 (seven pages).
German-language Search Report issued in counterpart German Application No. 10 2015 215 993.0 dated Mar. 22, 2016 with partial English translation (14 page).
Reichardt et al., "Using a Synthesis Methodology for the Design of Automotive Antenna Systems", 7th European Conference on Antennas and Propagation (EuCAP), Apr. 8, 2013, pp. 1600-1604, XP032430312.
Low et al., "Hidden Automotive Antenna Performance and Simulation", IEEE Transactions on Antennas and Propagation, Dec. 1, 2006, pp. 3707-3712, vol. 54, No. 12, IEEE Service Center, Piscataway, New Jersey, XP011151451.
Ulrich et al., "Effiziente Simulationsmethoden fuer die Optimierung von komplexen Fahrzeugantennensystemen", Technische Universitaet Muenchen: Lehrstuhl fuer Hochfrequenztechnik, Apr. 27, 2009, 84 pages, XP055318707.
Ullrich et al., "Effiziente Simulationsmethoden fuer die Optimierung von komplexen Fahrzeugantennensystemen", Technische Universitaet Muenchen: Lehrstuhl fuer Hochfrequenztechnik, Apr. 27, 2009, XP055318707 with unverified English translation (183 pages).

* cited by examiner

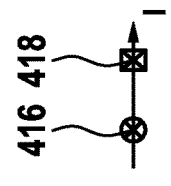
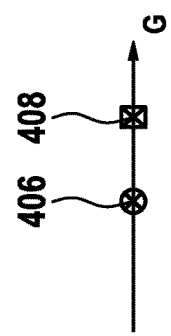
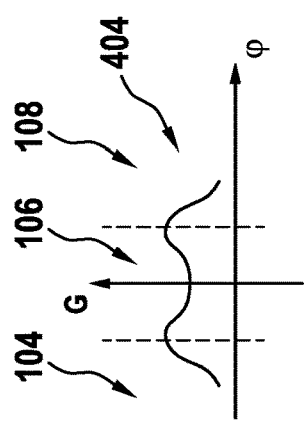
Fig. 4c
Fig. 4b
Fig. 4a
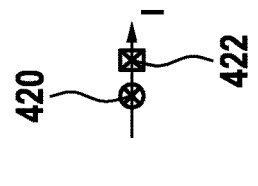
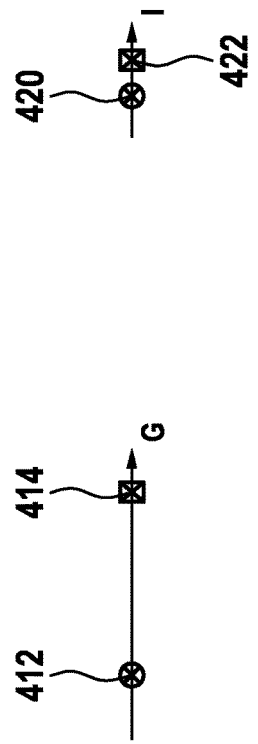
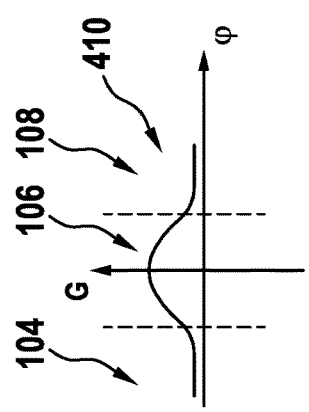
Fig. 4f
Fig. 4e
Fig. 4d

ASSESSMENT AND/OR DESIGN OF MULTIPLE-ANTENNA SYSTEMS

CROSS REFERENCE TO RELATED APPLICATIONS

This application is a continuation of PCT International Application No. PCT/EP2016/069466, filed Aug. 17, 2016, which claims priority under 35 U.S.C. § 119 from German Patent Application No. 10 2015 215 993.0, filed Aug. 21, 2015, the entire disclosures of which are herein expressly incorporated by reference.

BACKGROUND AND SUMMARY OF THE INVENTION

The present invention relates to a method for assessing and/or designing multiple-antenna systems, in particular multiple-antenna systems for use in a motor vehicle. The present invention permits a simplified and improved assessment and design of antenna systems comprising a plurality of antennas.

Current and future radio standards such as LTE, 5G and IEEE 802.11p, use systems with distributed antennas. There exist currently no suitable methods for assessing and designing such systems with a plurality of antennas.

In particular, as regards the use in a motor vehicle, it must be ensured that safety-critical information can be reliably received from an area in front of and/or behind the motor vehicle. Furthermore, it must be ensured that in order to achieve high transmission rates, for example for multimedia data, simultaneous sending and receiving is ensured via multiple antennas (MIMO=multiple input multiple output).

U.S. Pat. No. 6,266,528 B1 discloses the use of statistical methods for detecting defective antennas in an antenna array.

It is an objective of the present invention to propose an improved method for assessing and/or designing systems with multiple antennas.

This objective is met by a method and a computer program product according to the independent claims. The dependent claims refer to preferred embodiments.

The method as claimed by the invention for determining the performance of at least one antenna of a system with multiple antennas comprises the step of dividing a reception area and/or a transmission area of the antenna into a plurality of spatial sectors, subsequently called sectors, of determining at least one value of a performance parameter indicating an antenna performance for at least one sector of the plurality of sectors and of determining a statistical value from the values of the at least one performance parameter. As a result, sectors of an antenna can be selected which are particularly relevant for assessing and/or designing the antenna system. By reducing the complex characteristics of performance parameters of an antenna to statistical values, it becomes easier to perform a comparison of antennas of a system comprising multiple antennas, and therefore antenna systems are easier to compare and/or to design. The method may be implemented in a computer and executed on a computer.

The reception area and/or the transmission area of the antenna may be at least a partial sphere. If the antenna transmits into all directions and/or receives signals from all spatial directions, the reception area and/or the transmission area may be a sphere. If the antenna does not transmit into all spatial directions and/or does not receive signals from all spatial directions, the reception area and/or the transmission area is a partial sphere. The sector may be an area element of the partial sphere. The performance parameter is determined in a plurality of spatial directions, which are covered by the sector.

The statistical value may be, for example, a maximum value, a minimum value, a mean value, an arithmetic mean value, a geometric mean value, a root mean square value, a scattering, a variance, a standard deviation, a mean deviation or the like of the performance parameter determined in a plurality of spatial directions.

The performance parameter may comprise the directional factor, the antenna gain, the directivity, the degree of efficiency or the like.

The method further comprises the step of combining the at least one statistical value of a sector of a plurality of antennas of an antenna system to form a combined value. In this way the entire antenna system can be assessed and/or designed. The inventor of the present invention proposes to initially assess and/or design each antenna individually. Subsequently a system with a plurality of such antennas can be assessed and/or designed. As a result the complexity of assessing and/or designing antenna systems can be reduced and the development time may be reduced.

The step of combining the at least one statistical value of a sector of a plurality of antennas of an antenna system to form a combined value may comprise at least one of the following steps. It is possible to determine the maximum value of a statistical value of a sector of a plurality of antennas. It is possible to determine the minimum value of a statistical value of a sector of a plurality of antennas. It is possible to determine a random mean value of a statistical value of a sector of a plurality of antennas. It is possible to determine the arithmetic mean value of a statistical value of a sector of a plurality of antennas. It is possible to determine the geometric mean value of a statistical value of a sector of a plurality of antennas. It is possible to determine the root mean square value of a statistical value of a sector of a plurality of antennas. It is possible to determine a random scattering of a statistical value of a sector of a plurality of antennas. It is possible to determine a random variance of a statistical value of a sector of a plurality of antennas. The step of combining the statistical value of a sector may be carried out in dependence on the performance parameter, which is represented by the statistical value.

The method may comprise the step of determining optimized locations and/or the required number of antennas dependent on the at least one combined value. This step may be performed interactively and/or iteratively in that, for example, different types of antennas and/or a different number of antennas are used and/or the antennas are arranged at different locations.

The performance parameter and/or the statistical value and/or the combined value and/or the sector may be selected dependent on an application for transmitting a signal. For a security application in a motor vehicle the emphasis is on the forward-facing and/or rearward-facing sector of an antenna array, for example, in order to ensure communication from motor vehicle to motor vehicle. For applications that require a high bandwidth the emphasis is on the directivity and decoupling of channels, which are received via different antennas by means of MIMO. Motor vehicles in terms of this patent application include, among others, land vehicles, passenger vehicles, trucks and motorized two-wheelers.

The plurality of antennas may be arranged on a motor vehicle, whereby an antenna may be arranged on an A-pillar, a B-pillar, a C-pillar, a front bumper, a rear bumper, a roof, a boot lid, a lamp in the front area of the motor vehicle, a lamp in the rear area of the motor vehicle, an external mirror, a boot lid, a window pane, in particular an upper area of a front windscreen, and/or a random area clad with a non-metallic material.

The invention also relates to a non-transitory computer program product which, when loaded into a memory of a computer with a processor and in particular is executed in the processor, executes the above-described method.

Other objects, advantages and novel features of the present invention will become apparent from the following detailed description of one or more preferred embodiments when considered in conjunction with the accompanying drawings.

BRIEF DESCRIPTION OF THE DRAWINGS

The invention will now be explained with reference to the accompanying figures which show embodiments of the invention, wherein the figures serve a better understanding and are not to be interpreted as being restrictive, wherein:

FIGS. 4a-4h, by way of example, show the antenna gain of different antenna types and statistical values derived therefrom;

DETAILED DESCRIPTION OF THE DRAWINGS

Figure 1:
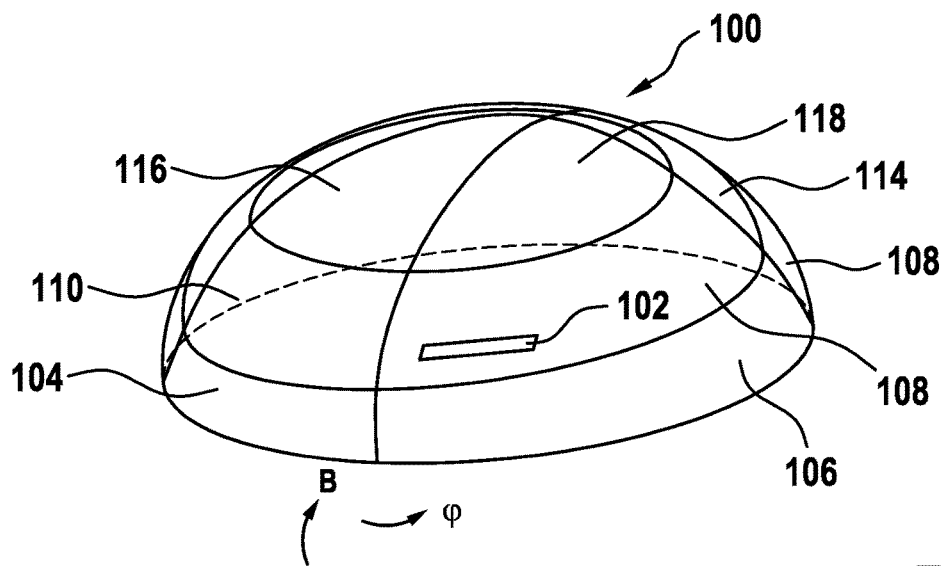
FIG. 1 shows an antenna in a partial spatial sphere.

FIG. 1 shows an antenna 102, which is depicted in a spatial sphere 100. The spatial sphere is divided into a plurality of spatial segments (sectors), which are represented in an exemplary manner by the area elements 104-118. In azimuth direction the area elements 104, 106, 108 are depicted as spatial segments, subsequently called segments. In elevation direction the segments 104, 110, 116 and the segments 106, 112, 118 can be seen.

According to the invention antenna performance parameters of antenna 102 are determined for each of the segments 104-118 and statistical values are derived therefrom. The antenna performance parameters may, for example, be the directional factor, the directivity, the degree of efficiency, the antenna gain or the like, per segment.

The directional factor, the directivity, the degree of efficiency and/or the antenna gain may be considered at a frequency point across a plurality of spatial directions because they are dependent on the spatial direction. The statistical value may comprise a maximum value, a minimum value, a mean value, an arithmetic mean value, a geometric mean value, a root mean square value, a scattering, a variance, a standard deviation, a mean deviation or the like of this exemplary antenna performance parameter in a plurality of spatial directions which are covered by the segment.

The maladjustment and the decoupling of an antenna are not dependent on the spatial direction, but may vary within a frequency band.

These parameters are determined at a plurality of frequency points within a frequency band. The statistical value may comprise a maximum value, a minimum value, a mean value, an arithmetic mean value, a geometric mean value, a root mean square value, a scattering, a variance, a standard deviation, a mean deviation or the like of this exemplary antenna performance parameter across a plurality of frequency points within a frequency band.

Figure 2:
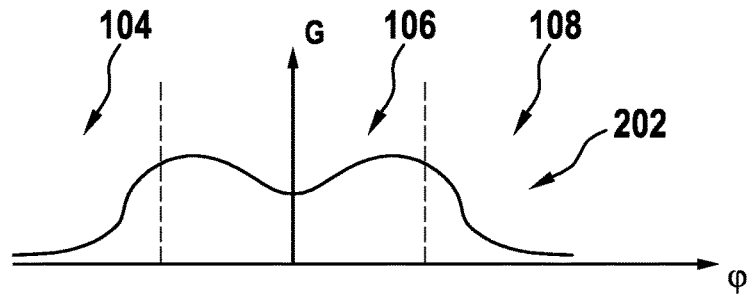
FIG. 2 shows a diagram of the antenna gain across a plurality of segments of the spatial sphere.

FIG. 2 shows the antenna gain of antenna 102 in segment 106 across the azimuth angle. Furthermore, the boundaries of the three sectors 104, 106, 108 are drawn as broken lines. For reasons of simplifying the view and the explanation of the invention the antenna gain in FIG. 2 is shown merely in dependence of the azimuth angle. Dependence of the elevation angle has been neglected in order to improve clarity. The antenna gain G shown in FIG. 2 is shown in a graph 202 with two maxima and a local minimum. For high azimuth angles the antenna gain extends more or less in asymptotic direction veering towards zero.

Figure 3:
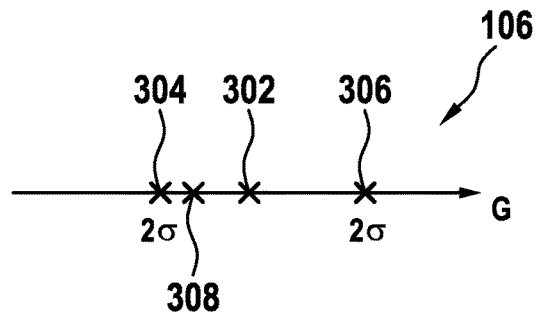
FIG. 3 shows selected statistical values of the antenna gain in a segment.

FIG. 3 shows statistical values which have been plotted along an axis. The statistical values for the segment 106 were determined from the antenna gain G as antenna performance parameters. Reference symbol 302 denotes a mean value. Reference symbol 308 denotes a minimum value. Reference symbol 304 denotes a mean value minus a scattering, in this case −2× standard deviation. Reference symbol 306 denotes the mean value plus a scattering, in this case +2× standard deviation.

Reference is made to FIGS. 4a-4d, which show an antenna performance parameter and its statistical values for two antennas.

FIG. 4a comprises the graph 404 showing the progression of the antenna gain G. In the segment 106, the graph 404 has two maxima and a local minimum. FIG. 4b shows the maximum value at reference symbol 408 and the minimum value at reference symbol 406. The first segment 106 also covers the directivity D. In order to simplify the view, FIG. 4c merely shows the maximum value for the directivity at 418 and the minimum value for the directivity at 416.

FIG. 4d shows the antenna gain of a second antenna type in the three segments 104, 106, 108, and this is shown as graph 410. The antenna gain has a local maximum, drops parabolically and then remains at a low level. FIG. 4e shows the maximum value at reference symbol 414 and the minimum value at reference symbol 412. Furthermore, FIG. 4f shows the maximum value of the antenna directivity of the second antenna type at reference symbol 422 and the minimum value of the antenna directivity at reference symbol 424.

Figure 4G:
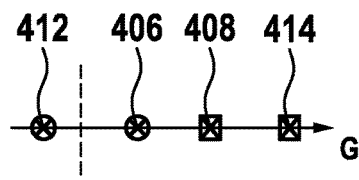

FIG. 4g shows the statistical parameters of the first antenna system and the second antenna system. Reference symbol 414 shows the maximum of the antenna gain of the second antenna system, reference symbol 408 shows the maximum value of the antenna gain of the first antenna system, reference symbol 406 shows the minimum value of the antenna gain of the first antenna system and reference symbol 412 shows the minimum value of the antenna gain of the second antenna system. The broken line in FIG. 4g shows the threshold value for the required minimum of the antenna gain for the segment 106, for which the statistical parameters 406-414 were determined. All maximum values of the antenna gain of the two antennas lie above the threshold value. Furthermore, at least one minimum value 406 lies above the threshold value represented by the broken line. This proves that the system with the first antenna and the second antenna is suitable to meet the requirements placed on the antenna gain. If the segment 106 in a motor vehicle is facing forward, the antenna system represented in FIGS. 4a-4f can be used for a communication from motor vehicle to motor vehicle, for example in order to communicate warning messages, as an example for a first application.

Figure 4H:
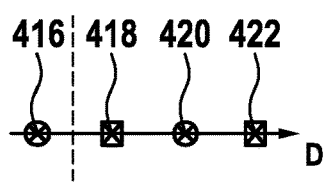

In FIG. 4h the antenna system discussed with regard to FIGS. 4a-4f is considered for a second application for which, for example, high data rates are to be achieved in order to transmit multimedia data. In this case the important point is the directivity between different antennas. FIG. 4h shows the maximum value 422 of the directivity of the second antenna system, the minimum value 420 of the directivity of the second antenna system, the maximum value 418 of the directivity of the first antenna system and the minimum value 416 of the antenna directivity of the first antenna, respectively, in the segment 106. The minimum value 416 of the directivity of the first antenna system lies below a threshold value represented by the broken line. Therefore, the antenna system considered in FIGS. 4a-4f would not be suitable for a communication with MIMO because one minimum value 416 of the antenna directivity lies below the threshold value. The antenna system considered in FIGS. 4a-4f could, however, be suitable for a communication with MIMO in case other segments offer a higher antenna directivity and/or if scatterings occur along the transmission section, for example due to a building or the like, so that signals can be received or transmitted under another angle spectrum.

Figure 5:
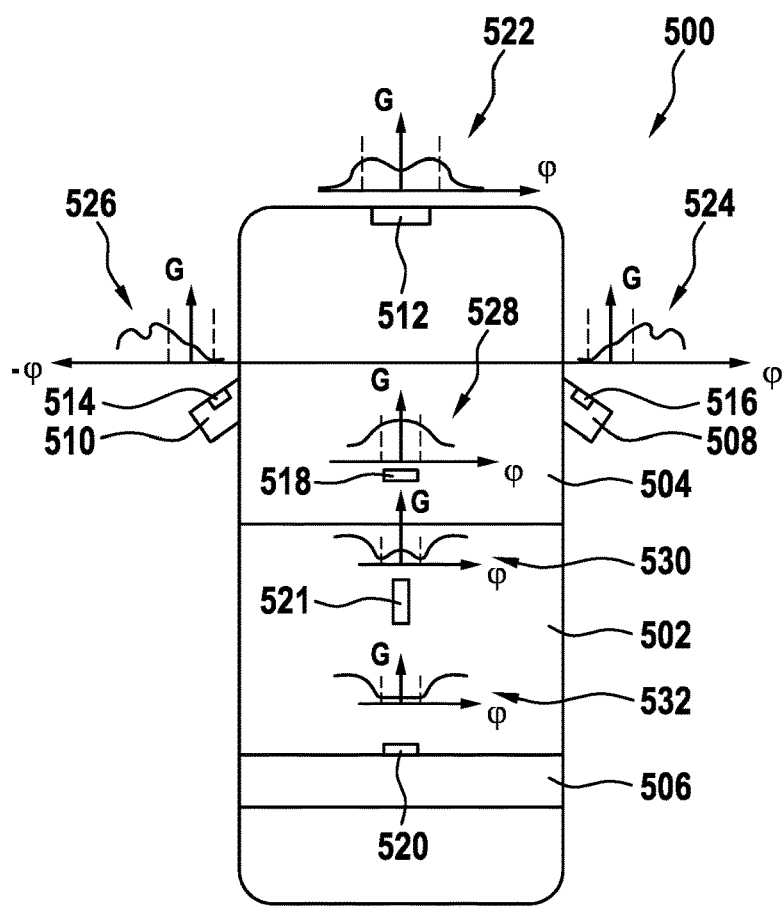
FIG. 5 shows an antenna array on a motor vehicle and the respective antenna gain.

Reference is made to FIG. 5, which shows a plurality of antennas 512, 514, 516, 518, 520, 521 on a motor vehicle 500. The first antenna 512 is arranged on the front bumper. The second antenna 514 is arranged in the left external mirror 510. The third antenna 516 is arranged in the right external mirror 508. The fourth antenna 518 is arranged between roof liner and windscreen. The fifth antenna 521 is arranged on the roof. The sixth antenna 520 is arranged in the roof spoiler.

The first antenna 512 has the antenna gain shown in the diagram 522 over the azimuth angle. The second antenna 514 has the antenna gain shown as graph 526 over the azimuth angle. The third antenna 516 has the antenna gain shown as graph 524 over the azimuth angle. The fourth antenna 518 has the antenna gain shown as graph 528 over the azimuth angle. The fifth antenna 521 has the antenna gain shown as graph 530 over the azimuth angle. The sixth antenna has the antenna gain shown as graph 532 over the azimuth angle.

In FIGS. 6a-6e the first application considered is a communication from one motor vehicle 500 to another motor vehicle for the purpose of exchanging danger messages. To this end merely one forward-facing segment of the spatial sphere 100 is considered, which is arranged between the broken lines in the graphs 522, 524, 526, 528, 530, 532. Graph 530 reveals that the fifth antenna 512 mainly receives signals from, or transmits signals in, a lateral direction. Graph 532 reveals that the sixth antenna 520 mainly transmits signals to, and/or receives signals from, the rear. Therefore, the fifth antenna 521 and the sixth antenna 520 are not considered for forward-facing communication.

Figure 6A:
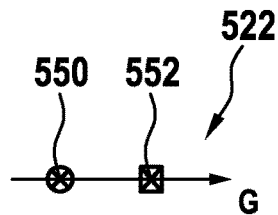
FIGS. 6a-6e show a statistical assessment of the antenna gains of the antennas arranged on the motor vehicle.
Figure 6B:
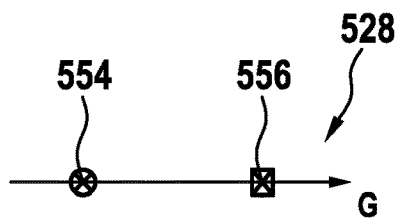
Figure 6C:
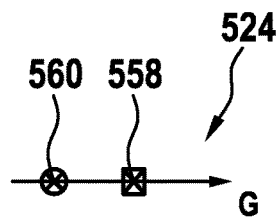
Figure 6D:
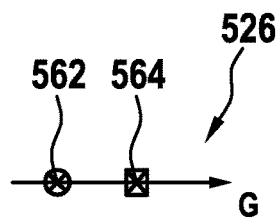
Figure 6E:
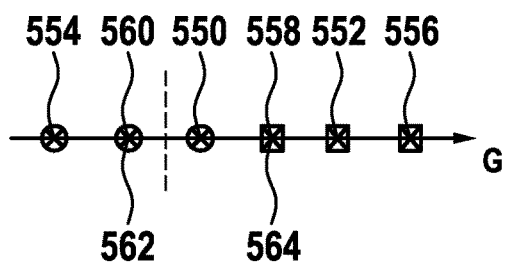

FIG. 6a shows the maximum value 552 and the minimum value 550 of the antenna gain of the first antenna in the graph 522. FIG. 6b shows the maximum antenna gain 556 and the minimum antenna gain 554 of the fourth antenna 518 in graph 528. FIGS. 6c and 6d show the maximum antenna gain 558, 564 and the minimum antenna gain 560, 562 of the second antenna 514 in graph 526 and of the third antenna 516 in graph 524. FIG. 6e shows a threshold value plotted for an antenna gain, which must be achieved by the depicted antenna system in the forward-facing segment. All maximum values 552, 556, 558, 564 lie above the threshold value. Furthermore, the minimum value 550 of the first antenna 512 lies above the threshold value. Therefore, the antenna system depicted in FIG. 5 is suitable for a communication from motor vehicle to motor vehicle for the purpose of exchanging warning messages which are typically received from the front by a preceding motor vehicle.

Figure 7:
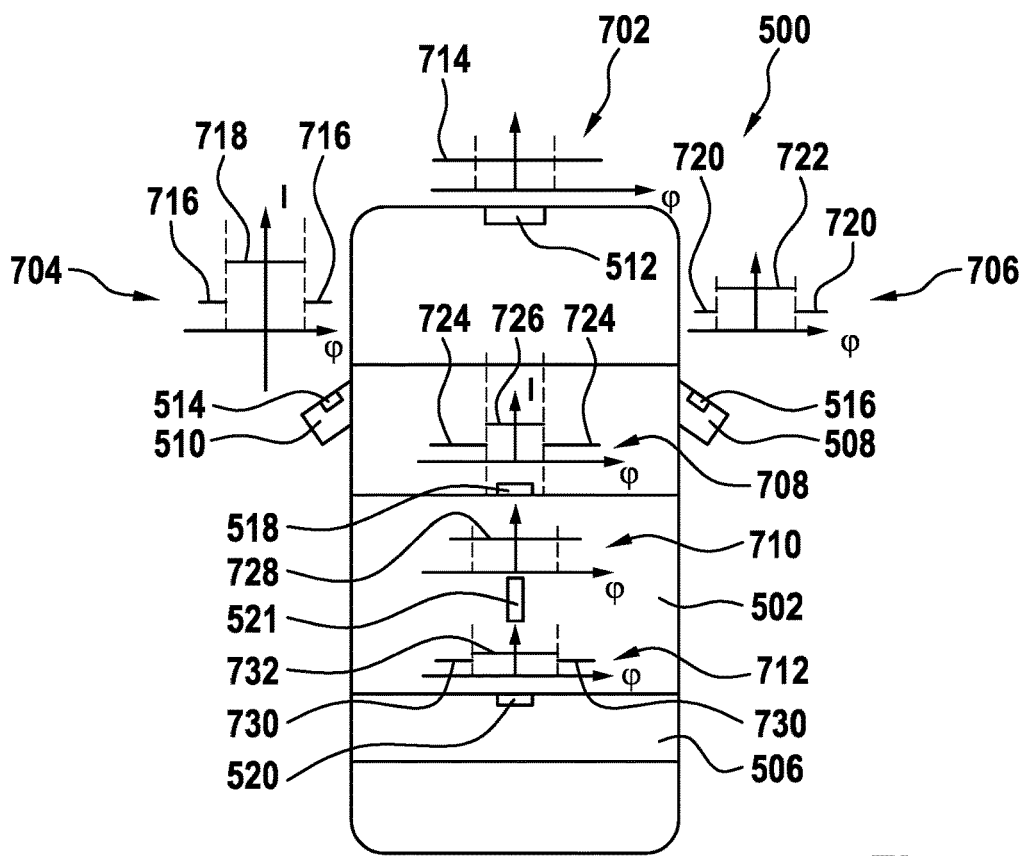
FIG. 7 shows the antenna array on the motor vehicle and the directivity dependent on the segment.

Reference is made to FIG. 7, which shows the motor vehicle 500 with antennas 512, 514, 516, 518, 520, 521. FIG. 7 shows statistical parameters in the diagrams 702, 704, 706, 708, 710, 712, i.e., the directivity, in three segments. The segment to the left of the broken line in diagrams 702, 704, 706, 708, 710, 712 represents a first segment. The second segment in the previously mentioned diagrams 702-712 is located between the broken lines. The third segment in the diagrams 702-712 is located to the left of the two broken lines.

The application considered in FIG. 7 is an application, which requires a high data transmission rate and thus an antenna directivity for MIMO. Data with a high data rate is typically received from base stations of a motor vehicle 500, wherein they are scattered and reflected at objects due to the distance between the base station and the motor vehicle.

The diagram 702 shows the mean value 714 of the directivity of the first antenna 512 in the first segment, the second segment and the third segment. The diagram 704 shows the mean value of the directivity 716 in the first segment and the third segment and the mean value of the directivity 718 in the second segment of the third antenna 514. The diagram 706 shows the mean value of the directivity 720 in the first segment and the third segment and the mean value of the directivity 722 in the second segment of the third antenna 516. The diagram 708 shows the mean value of the directivity 724 in the first segment and the third segment and the mean value of the directivity 726 in the second segment of the fourth antenna 518. The diagram 710 shows the mean value of the directivity 728 of the fifth antenna 521 in the first segment, the second segment and the third segment. The diagram 712 shows the mean value of the directivity 730 in the first segment and the third segment and the mean value of the directivity 732 in the second segment of the sixth antenna 520.

Figure 8A:
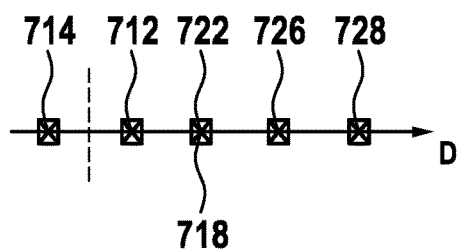
FIGS. 8a and 8b show a segment-dependent view of a statistical parameter in a plurality of segments.

Reference is made to FIG. 8a, which shows the mean values 714, 718, 722, 726, 728, 732 of the directivity. The broken line denotes a threshold value for a minimum directivity to be adhered to by the antenna system. The mean values shown in FIG. 8a refer to the forward-facing second segment. The mean value 714 of the first antenna 512 is below the threshold value. The mean value 718 of the second segment of the second antenna 514, the mean value 722 in the second segment of the third antenna 516, the mean value 726 in the second segment of the fourth antenna 518 and the mean value 728 of the directivity in the second segment of the fifth antennas 721 and the mean value 732 of the directivity in the second segment of the sixth antennas 520 are above the threshold value. Thus, it can be assumed that in the second segment at least five antennas 514, 516, 518, 520, 521 are available for MIMO. Assessment of the communication by means of MIMO in this simplified and exemplary embodiment is performed by merely using the mean value of the directivity for explanation because signals, due to the scattering on objects such as buildings, are incident on the antenna under a comparably wide angle spectrum.

Figure 8B:
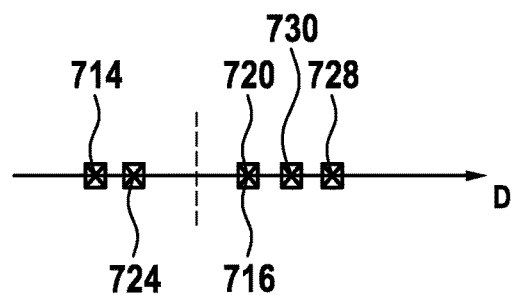

Reference is made to FIG. 8b, which shows the mean values 714, 716, 720, 724, 728, 730 of the directivity in the first and third segment, which are directed towards the right/towards the left. The mean value of the directivity of the first antenna 512 and the mean value of the directivity of the fourth antenna 518 lie in the first and the third segment below the threshold value shown as a broken line. The first and the third segment contain the mean value of the directivity 716 of the second antenna 514, the mean value 720 of the directivity of the third antenna 516, the mean value 728 of the directivity of the fifth antenna 521 and the mean value 730 of the directivity of the sixth antenna 520 which all lie above the threshold value plotted as a broken line. Therefore at least four antennas are available in the first and in the third segment for a communication with MIMO. The antenna system shown in FIG. 7 is thus also suitable for MIMO.

Provided it can also be assumed that signals can be received and transmitted with a large scattering there is no need for treating the directivity of the antenna system shown in FIG. 7 separately for three segments. Then all mean values of the three segments can be compared with one threshold value.

The present invention proposes a method which permits the assessment and design of systems with a number of antennas in a simple manner. To this end the spatial area covered by the antennas is divided into spatial sectors/spatial segments. Each sector has statistical parameters determined for it. The comparison of the antennas and the antenna systems is carried out by means of the statistical parameters. As a result, the complexity of the comparison can be distinctly reduced.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for determining performance of at least one antenna of a system with multiple antennas, comprising:
    dividing at least one of a reception area and a transmission area of the at least one antenna into a plurality of spatial sectors, wherein the multiple antennas are arranged on a vehicle, including a first group of antennas arranged along a longitudinal axis of the vehicle;
    determining at least one value of a performance parameter, which shows an antenna performance for at least one spatial sector of the plurality of spatial sectors;
    determining at least one statistical value from the at least one value of the at least one performance parameter; and
    combining the at least one statistical value of the at least one spatial sector of each of the multiple antennas of the system to form a combined value.

2. The method as claimed in claim 1, wherein
    the at least one of the reception area and the transmission area of the at least one antenna is at least a partial sphere; and
    the at least one spatial sector is an area element of the at least the partial sphere.

3. The method as claimed in claim 2, wherein the statistical value is at least one of a maximum value, a minimum value, a mean value, an arithmetic mean value, a geometric mean value, a root mean square value, a scattering, a variance, a standard deviation, and a mean deviation.

4. The method as claimed in claim 2, wherein the performance parameter comprises at least one of a directional factor, an antenna gain, a directivity, and a degree of efficiency.

5. The method as claimed in claim 2, wherein the step of combining the at least one statistical value of the spatial sector of the plurality of antennas of the antenna system to form a combined value comprises at least one of:
    determining a maximum value of the at least one statistical value of the spatial sector of the plurality of antennas;
    determining a minimum value of the at least one statistical value of the spatial sector of the plurality of antennas;
    determining a random mean value of the at least one statistical value of the spatial sector of the plurality of antennas;
    determining an arithmetic mean value of the at least one statistical value of the spatial sector of the plurality of antennas;
    determining a geometric mean value of the at least one statistical value of the spatial sector of the plurality of antennas;
    determining a root mean square value of the at least one statistical value of the spatial sector of the plurality of antennas;
    determining a random scattering of the at least one statistical value of the spatial sector of the plurality of antennas;
    determining a variance of the at least one statistical value of the spatial sector of the plurality of antennas.

6. The method as claimed in claim 2, wherein at least one of the performance parameter, the statistical value, the combined value and the spatial sector are selected dependent on an application for transmitting a signal.

7. The method as claimed in claim 2, wherein the plurality of antennas is arranged on a motor vehicle, and at least one antenna is arranged at one of an A-pillar, a B-pillar, a C-pillar, a front bumper, a rear bumper, a roof, a boot lid; a lamp in a front area of the motor vehicle; a lamp in a rear area of the motor vehicle; an external mirror, a boot lid, a spoiler, a window pane, and a random area clad with a non-metallic material.

8. The method as claimed in claim 1, wherein the statistical value is at least one of a maximum value, a minimum value, a mean value, an arithmetic mean value, a geometric mean value, a root mean square value, a scattering, a variance, a standard deviation, and a mean deviation.

9. The method as claimed in claim 8, wherein at least one of the performance parameter, the statistical value, the combined value and the spatial sector are selected dependent on an application for transmitting a signal.

10. The method as claimed in claim 8, wherein the plurality of antennas is arranged on a motor vehicle, and at least one antenna is arranged at one of an A-pillar, a B-pillar, a C-pillar, a front bumper, a rear bumper, a roof, a boot lid; a lamp in a front area of the motor vehicle; a lamp in a rear area of the motor vehicle; an external mirror, a boot lid, a spoiler, a window pane, and a random area clad with a non-metallic material.

11. The method as claimed in claim 1, wherein the performance parameter comprises at least one of a directional factor, an antenna gain, a directivity, and a degree of efficiency.

12. The method as claimed in claim 11, wherein at least one of the performance parameter, the statistical value, the combined value and the spatial sector are selected dependent on an application for transmitting a signal.

13. The method as claimed in claim 1, wherein the step of combining the at least one statistical value of the spatial sector of the plurality of antennas of the antenna system to form a combined value comprises at least one of:
- determining a maximum value of the at least one statistical value of the spatial sector of the plurality of antennas;
- determining a minimum value of the at least one statistical value of the spatial sector of the plurality of antennas;
- determining a random mean value of the at least one statistical value of the spatial sector of the plurality of antennas;
- determining an arithmetic mean value of the at least one statistical value of the spatial sector of the plurality of antennas;
- determining a geometric mean value of the at least one statistical value of the spatial sector of the plurality of antennas;
- determining a root mean square value of the at least one statistical value of the spatial sector of the plurality of antennas;
- determining a random scattering of the at least one statistical value of the spatial sector of the plurality of antennas;
- determining a variance of the at least one statistical value of the spatial sector of the plurality of antennas.

14. The method as claimed in claim 13, further comprising:
- determining at least one of optimized locations and a required number of antennas dependent on the at least one combined value.

15. The method as claimed in claim 1, further comprising:
- determining at least one of optimized locations and a required number of antennas dependent on the at least one combined value.

16. The method as claimed in claim 1, wherein at least one of the performance parameter, the statistical value, the combined value and the spatial sector are selected dependent on an application for transmitting a signal.

17. The method as claimed in claim 1, wherein the plurality of antennas is arranged on a motor vehicle, and at least one antenna is arranged at one of an A-pillar, a B-pillar, a C-pillar, a front bumper, a rear bumper, a roof, a boot lid; a lamp in a front area of the motor vehicle; a lamp in a rear area of the motor vehicle; an external mirror, a boot lid, a spoiler, a window pane, and a random area clad with a non-metallic material.

18. A non-transitory computer-readable medium storing instructions, which, when executed by a computer with a processor, executes the instructions comprising:
- dividing at least one of a reception area and a transmission area of at least one antenna into a plurality of spatial sectors, wherein the multiple antennas are arranged on a vehicle, including a first group of antennas arranged along a longitudinal axis of the vehicle;
- determining at least one value of a performance parameter, which shows an antenna performance for at least one spatial sector of the plurality of spatial sectors;
- determining at least one statistical value from the at least one value of the at least one performance parameter; and
- combining the at least one statistical value of the at least one spatial sector of each of the multiple antennas of the system to form a combined value.

* * * * *